United States Patent [19]

Agou et al.

[11] Patent Number: 5,246,767
[45] Date of Patent: Sep. 21, 1993

[54] HIGH LIGHT-TRANSMISSIVE DUST-PROOF BODY AND METHOD OF PREPARING SAME

[75] Inventors: Tokinori Agou; Hiroaki Nakagawa, both of Yamaguchi, Japan

[73] Assignee: Mitsui Petrochemical Industries, Ltd., Tokyo, Japan

[21] Appl. No.: 449,000

[22] Filed: Dec. 12, 1989

[30] Foreign Application Priority Data

Dec. 13, 1988 [JP] Japan .................................. 63-314611
Dec. 13, 1988 [JP] Japan .................................. 63-314612

[51] Int. Cl.⁵ ............................................ B32B 7/02
[52] U.S. Cl. ..................................... 428/212; 428/336; 428/702; 427/165; 427/167; 501/12; 501/53; 501/133
[58] Field of Search ............... 428/212, 336, 702, 38, 428/46; 427/165, 167; 501/12, 53, 54, 133, 900, 40

[56] References Cited

U.S. PATENT DOCUMENTS

| | | | |
|---|---|---|---|
| 4,269,916 | 5/1981 | Bilofsky et al. | 430/11 |
| 4,313,648 | 2/1982 | Yano et al. | 350/166 |
| 4,333,983 | 6/1982 | Allen | 428/336 |
| 4,377,613 | 3/1983 | Gordon | 350/166 |
| 4,704,299 | 11/1987 | Wielonski et al. | 427/397.7 |
| 4,759,901 | 1/1988 | Yen | 428/421 |
| 4,769,058 | 9/1988 | McMaster | 65/113 |
| 4,815,821 | 3/1989 | Nonogaki et al. | 350/164 |
| 4,854,670 | 8/1989 | Mellor | 350/166 |
| 4,874,462 | 10/1989 | Makita et al. | 156/651 |
| 4,929,278 | 5/1990 | Ashley et al. | 106/287.12 |
| 4,965,121 | 10/1990 | Young et al. | 428/212 |
| 4,977,013 | 12/1990 | Ritchie et al. | 428/336 |

FOREIGN PATENT DOCUMENTS

| | | |
|---|---|---|
| 0224985 | 6/1987 | European Pat. Off. |
| 60-237450 | 11/1985 | Japan . |
| 61-53601 | 3/1986 | Japan . |
| 61-209449 | 9/1986 | Japan . |
| 62-127801 | 6/1987 | Japan . |
| 62-288842 | 12/1987 | Japan . |
| 63-6553 | 1/1988 | Japan . |

OTHER PUBLICATIONS

Patent Abstract of Japan, vol. 12, No. 178, (P-708) (3025), May 26, 1988.
JP-A-63 262 651 and Patent Abstracts of Japan, vol. 13, No. 80 (P-832) (3428), Feb. 23, 1989.
Patent Abstracts of Japan, vol. 10, No. 106 (P-449) (2163), Apr. 22, 1986, p. 36 P 449, and JP-A-60 237 450.
Patent Abstracts of Japan, vol. 10, No. 215 (P-481) (2271), Jul. 26, 1986, p. 60 P 481 and JP-A-61 053 601.
Patent Abstracts of Jaopan, vol. 11, No. 40 (P-544) (2487), Feb. 5, 1987, p. 78 P 544; and JP-A-61 209 449.

*Primary Examiner*—P. C. Sluby
*Assistant Examiner*—R. Follett
*Attorney, Agent, or Firm*—Sherman and Shalloway

[57] ABSTRACT

A high light-transmissive dust-proof body equipped with a holding frame to be mounted on a mask substrate and a transparent light-transmissive film mounted on the holding frame, wherein the light-transmissive film comprises an inorganic film having a thickness of 0.2 µm to less than 10 µm and transmitting light having wavelengths of 240 to 500 nm at an average light transmittance of at least 85%, wherein the light-transmissive film forms (i) a three-layer structure of a low refractive index layer/high refractive index layer/base layer, or (ii) a five-layer structure comprising a low refractive index layer/high refractive index layer/base layer/high refractive index layer/low refractive index layer, the high refractive index layer being an inorganic layer and the low refractive index layer being an organic polymer.

8 Claims, 6 Drawing Sheets

HIGH LIGHT-TRANSMISSIVE DUST-PROOF BODY AND METHOD OF PREPARING SAME

BACKGROUND OF THE INVENTION

1. Field of the Invention

The present invention relates to a high (or highly) light transmissive dust-proof body allowing an excellent transmission of light, and a method of preparing the same. More specifically, it relates to a dust-proof body to be used for preventing a contamination by dust and foreign matter, etc., of a photomask and reticle (hereinafter referred to as a mask) to be used in the photolithographic step of the preparation of semiconductor elements such as IC and LSIs, etc., and a method of preparing same.

2. Description of the Related Art

In the photolithographic step, a mask having a circuit pattern formed of a film of chromium vapor deposited on a glass plate surface is used for transferring the circuit pattern onto a silicon wafer having a resist coated thereon. In this step, when an exposure is effected under conditions in which foreign matter such as dust, etc. can become attached to the circuit pattern on the mask, the above foreign matter is also transferred onto the wafer, and thus the product is defective. Particularly, when the above-mentioned exposure is effected by a stepper, it is extremely probable that all of the chips formed on the wafer are defective, and therefore, the contamination by foreign matter of the circuit pattern of the mask is a serious problem. To solve this problem, recently a dust-proof body (pellicle) having a transparent light-transmissive film arranged at an appropriate distance from one surface or both surfaces of the mask substrate has been used.

Such a dust-proof body generally comprises a transparent light-transmissive film of an organic material comprising nitrocellulose fixed on one side surface of a holding frame made of aluminum: the other end surface thereof being plastered with a double-sided sticky tape so as to be mountable onto a mask substrate. The use of this film prevents a penetration of foreign matter from outside, and even if foreign matter is attached to the film it will not be transferred onto a wafer, thus providing an improvement of the yield during the production of semiconductor elements.

As the transparent film constituting this dust-proof body, a single layer thin film of nitrocellulose is primarily utilized in the prior art, and to improve throughout in the exposure step, there has been proposed a dust-proof film having a reflection preventive layer comprising a laminated film composed of a high refractive index layer and a low refractive index layer provided on the transparent thin film of nitrocellulose (Japanese Unexamined Patent Publications (Kokai) Nos. 60-237450, 61-53601, 61-209449, 62-127801). Here, as the high refractive index layer forming the reflection preventive layer, polystyrene, polysulfone, polyether sulfone, polyphenylene ether, polycarbonate, aromatic polyester, polyvinylnaphthalene, are used.

Nevertheless, improvements in the degree of integration of semiconductor elements have shifted the light used for the exposure toward a shorter wavelength, from a g-beam (436 nm) to an i-beam (365 nm), and further, to an excimer laser (248 nm), and therefore, a problem arises in that the above-mentioned organic transparent film or the above-mentioned high refractive index layer of the organic material is deteriorated, whereby another problem arises in that the dust-proof film can no longer withstand practical application.

Further, the improvements in the degree of integration of semiconductor elements, which have caused a shift of the light during exposure toward a shorter wavelength, i.e., from a g-beam (436 nm) to an i-beam (365 nm), and further to an excimer laser (248 nm), have given rise to another problem in that photolysis occurs in a dust-proof body using the transparent thin film of an organic material of the prior art, and thus it can no longer be used for practical application.

SUMMARY OF THE INVENTION

Accordingly, the objects of the present invention are to eliminate the above-mentioned problems of the prior art and to provide a high light-transmissive dust-proof body in which photolysis will not occur even when a short wavelength light such as an excimer laser or i-beam is irradiated thereon for a long time, and having an excellent light transmittance.

Another object of the present invention is to provide a method of simply and quickly preparing a light-transmissive dust-proof body having the excellent properties mentioned above.

Other objects and advantages of the present invention will be apparent from the following description.

In accordance with the present invention, there is provided a high light-transmissive dust-proof body equipped with a holding frame to be mounted on a mask substrate and a transparent light-transmissive film mounted on the holding frame, wherein the light-transmissive film comprises an inorganic film having a thickness of 0.2 $\mu$m to less than 10 $\mu$m and able to transmit light having a wavelength of 240 to 500 nm at an average light transmittance of at least 85%.

In accordance with the present invention, there is also provided a method of preparing the above-mentioned high light-transmissive dust-proof body, which comprises fabricating a film by coating the sol formed by hydrolysis of a metal alkoxide, heating and calcining the film to form an inorganic film, and simultaneously, removing organic films by a decomposition process.

In accordance with the present invention, there is further provided a high light-transmissive dust-proof body equipped with a holding frame to be mounted on a mask substrate and a transparent light-transmissive film mounted on the holding frame, wherein the light-transmissive film has a three-layer structure of (i) a low refractive index layer/high refractive index layer/base layer, or (ii) a five-layer structure of a low refractive index layer/high refractive index layer/base layer/high refractive index layer/low refractive index layer, wherein the high refractive index layer is an inorganic layer and the low refractive index layer is an organic polymer.

BRIEF DESCRIPTION OF THE DRAWING

The present invention will be better understood from the description set forth below with reference to the accompanying drawings, in which:

FIGS. 2(a), (b) and (c) are sectional views of a first embodiment of the light-transmissive film according to the present invention;

FIGS. 3(a) and (b) are sectional views of a second embodiment of the light-transmissive film according to the present invention; and, FIGS. 4 to 8 are graphs showing fluctuations in transmittance versus the wavelength irradiated, in Comparative Examples 1 and 2 and Examples 3 to 5.

DESCRIPTION OF THE PREFERRED EMBODIMENT

The embodiments of the high light-transmissive dust-proof body according to the present invention will now be explained in detail with reference to the drawings.

Figure 1:
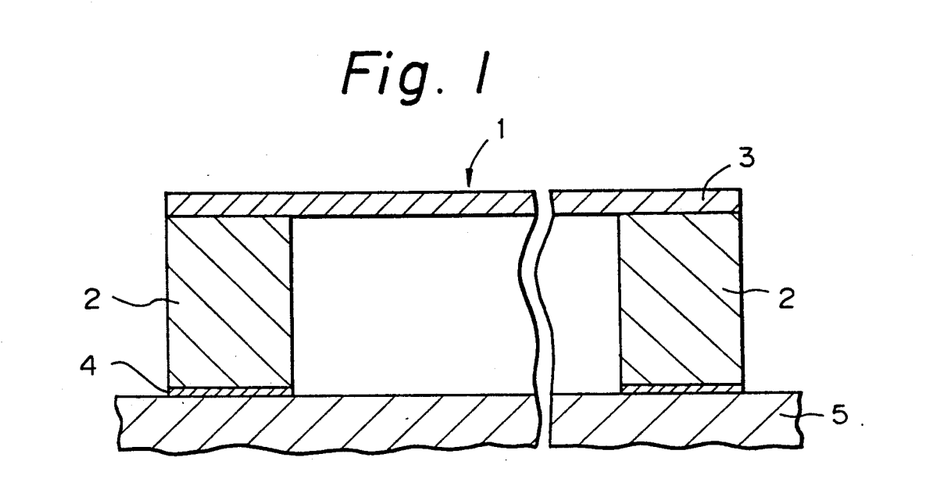
FIG. 1 is a sectional view showing one embodiment of the high light-transmissive dust-proof body of the present invention.

FIG. 1 is a sectional view showing an example of the high light-transmissive dust-proof body of the present invention. As shown in the FIG. 1, a high light-transmissive dust-proof body 1 having a light-transmissive film 3 is provided by fixing the dust-proof body 1 to one end surface of a holding frame 2, and the side surface on the opposite end of the holding frame 2 is mounted and held on a mask, such as a mask substrate 5, by a double-sided sticky tape 4, whereby the high light-transmissive dust-proof body 1 prevents an attachment of foreign matter such as dust, etc. to the mask substrate 5 during the preparation of semiconductor elements.

Figures 2A, 2B, 2C:
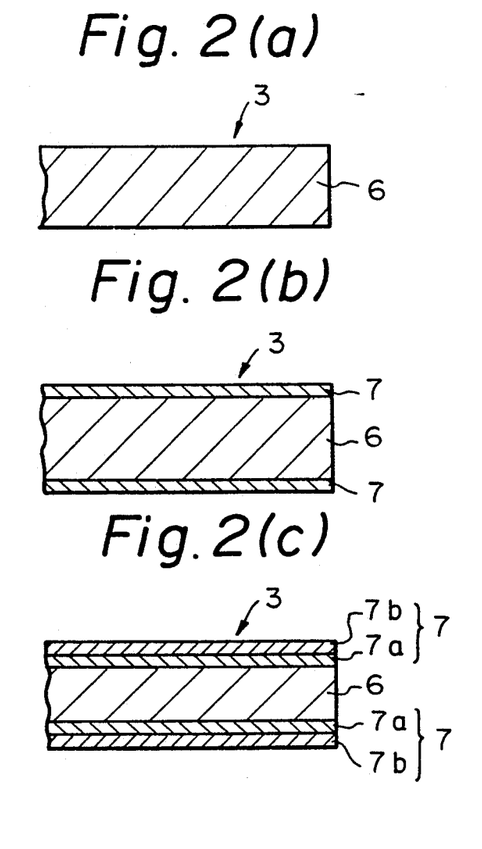

FIG. 2 is a sectional view of a first embodiment of the light-transmissive film 3 shown in FIG. 1. The light-transmissive film 3 shown in FIG. 2(a) consists only of an inorganic film 6, but a reflection preventive layer 7 also can be laminated on the inorganic film 6 as shown in FIGS. 2(b) and (c). The reflection preventive layer 7 shown in FIG. 2(b) is a single layer, but as shown in FIG. 2(c), the high refractive index layer 7a laminated on the inorganic film 6 can be a double layer, provided by laminating a low refractive index layer 7b on the high refractive index layer 7a.

The inorganic film 6 is preferably composed mainly of an oxide of silicon, but in addition to the oxide of silicon, elements such as Li, Na, K, Cs, Mg, Ca, Sr, Ba, Y, Ld, Ti, Zr, Hf, V, Nb, Ta, Cr, Fe, Co, Ni, Pd, Au, Zn, Cd, B, Al, In, C, Ge, Sn, Pb, N, P, As, Sb, O, S, F, etc. and oxides of these elements, may be contained in the inorganic film 6.

The inorganic film 6 can be prepared by the sol-gel method using a metal alkoxide as the starting material. The sol-gel method comprises dissolving a metal alkoxide as the starting material in an appropriate solvent, hydrolyzing the solution with an addition of water and a catalyst to prepare a sol, fabricating the sol into a film, and drying the film. This is followed by carrying out heating and calcination processes to form a gel into a glassy inorganic film.

Examples of the metal alkoxide usable in the present invention include tetraethoxysilane ($Si(OC_2H_5)_4$), titanium isopropoxide ($Ti(OCH[CH_3]_2)_4$), and zirconium propoxide ($Zr(OC_3H_7)_4$).

The solvent usable in the present invention is not particularly limited, and solvents used in a conventional sol-gel method can be used. Examples of such solvents include alcohols such as isopropanol, ethanol, and methanol. The amount of solvent used is not particularly limited, but is generally 1 to 2 parts by weight based on the metal alkoxide.

Examples of the catalyst usable in the present invention include hydrochloric acid, acetic acid, silicon tetrachloride, titanium tetrachloride, sodium hydroxide, and ammonia water. The amount of the catalyst added is preferably from 1 to 5 mole% based on the metal alkoxide.

The hydrolysis of the metal alkoxide is usually carried out at the reflux temperature of the solvent, and the reaction is usually carried out for 1 to 10 hours, preferably 3 to 6 hours. At this time, if an excess amount of water is added, —Si—O— bonds will form a network structure, whereby cracks are liable to occur in the film during the preparation, and therefore, the amount of water added is preferably 2-fold moles or less based on the metal alkoxide.

In the present invention, the metal alkoxide is hydrolyzed under the conditions as specified above to obtain a sol, which sol is formed into a thin film, and the formed film is dried and further subjected to heating and calcination to prepare the inorganic film 6.

The formation of the sol into a film is carried out as follows. Preferably a method is employed in which, first the sol is added dropwise on a thin film of an organic material (organic film) supported on a support made of a metal, a thin film is formed on the organic film by a rotatory film fabrication method using a spin coater, and the formed thin film is then dried with hot air. Although a film with a desired thickness can be formed by one operation, preferably, a film with a desired thickness is prepared by repeating the film formation and drying operations several times. This is because, if a film with a desired thickness is formed by one operation, cracks may occur during the drying of the film. The sol to be provided for film fabrication is preferably previously controlled to a desired viscosity by an evaporator, to the extent such that fabrication of the film can be easily accomplished. As the organic film to be used in the above-mentioned method, a film which can be completely removed by decomposition in a later heating calcination step is preferable. For example, a thin film of nitrocellulose can be employed.

The film formed as described above is peeled, together with the organic film, from the support, fixed on a separate frame, and then heated and calcined. The heating calcination process is performed at a temperature of 500° to 1000° C. for 0.5 to 5 hours, but prior thereto, preferably a preliminary calcination at a temperature of 180° to 500° C. is performed for 0.5 to 2 hours, as the organic film will be removed by the heat generated during this preliminary heating process.

A reflection preventive layer 7 can be formed on, the inorganic film 6 thus obtained, if necessary, and the whole fixed to a holding frame 2 to form the light-transmissive dust-proof frame 1.

In the present invention, the inorganic film 6 constituting the light-transmissive film 3 has a thickness of from 0.2 $\mu$m to less than 10 $\mu$m, and the light transmittance of the light-transmissive film 3 is such that light having a wavelength of 240 to 500 nm is transmitted at an average light transmittance of at least 85%. Here, the average light transmittance is a value determined by averaging the peaks and valleys in the same number of interference waves occurring between wavelengths of 240 and 500 nm.

When the thickness of the inorganic film 6 is less than 0.2 $\mu$m, the strength is too low and handling becomes difficult, but if the thickness of the film is 10 $\mu$m or more, a large number of aberrations will occur during exposure. Namely, the thickness of the inorganic film 6 must be such that the transmittance becomes higher relative to the wavelength of the light used for the exposure.

As shown in FIG. 2(a), when the light-transmissive film 3 consists only of the inorganic film 6, if the thickness of the inorganic film 6 is defined as $d_1$, the refractive index as $n_1$, and the wavelength as $\lambda$, reflection can be prevented when $$d_1 = m\lambda/2n_1 \text{ (where m is an integer of 1 or more)},$$

whereby a maximum light transmittance is obtained. For example, when $n_1 = 1.5$, to enhance the transmittance of a g-beam (436 nm), the film thickness $d_1$ is made 0.87 $\mu$m, and to enhance the transmittance of an excimer laser (248 nm), the film thickness $d_1$ is made 0.83 or 2.48 $\mu$m.

To prevent a lowering of the light transmittance because the inorganic film 6 does not have a desired thickness or to prevent fluctuations in the light transmittance relative to changes in the wavelength of the light, a reflection preventive layer 7 is laminated on the inorganic film 6 as shown in FIGS. 2(b) and (c). Accordingly, the thickness of the inorganic film 6 and fluctuations in the wavelength of the light will have little affect on the light transmittance, and thus variances in the film thickness can be ignored.

When the reflection preventive layer 7 is a single layer as shown in FIG. 2 (b), if the refractive index of the inorganic film 6 is defined as $n_1$, the refractive index of the reflection preventive layer 7 as $n_2$, and the thickness of the reflection preventive layer 7 as $d_2$, when the refractive indices and the film thickness satisfy both of the formulae (1) $\sqrt{n_1} = n_2$ and (2) $d_2 = m\lambda/4n_2$, reflection is prevented and a maximum light transmittance is obtained. Also, the reflection preventive layer 7 can be laminated on only one surface of the inorganic film 6, and in this case, the film thickness on the one surface is made $d_2$.

The refractive index $n_1$ of the inorganic film 6 made of an oxide of silicon is 1.5 to 1.6, and accordingly, a substance having a refractive index of $n_2 = \sqrt{n_1}$ of 1.22 to 1.26 may be laminated thereon. Such a substance is, for example, calcium fluoride ($CaF_2$). The lamination of this compound can be performed by the vacuum vapor deposition method or the sputtering method.

When the reflection preventive layer 7 consists of a high refractive index layer 7a and a low refractive index layer 7b as shown in FIG. 2(c), wherein the refractive index of the inorganic film 6 is defined as $n_1$, the refractive index of the high refractive index layer 7a as $n_2$, the thickness as $d_2$, the refractive index of the low refractive index layer 7b as $n_3$, and the thickness as $d_3$, if the refractive indexes and the film thicknesses satisfying the three formulae (a) $\sqrt{n_1} = n_2/n_3$, (2) $d_2 = m\lambda/4n_2$ and (3) $d_3 = m\lambda/4n_3$ are selected, reflection is completely prevented, and thus the light transmittance becomes higher. Also, the high refractive index layer 7a and the low refractive index layer 7b can be laminated on only one surface of the inorganic film 6, and in this case, the film thicknesses on the one surface are made $d_2$ and $d_3$.

As the substance for the material of the high refractive index layer 7a, for example, inorganic materials such as cerium fluoride ($CeF_3$), cesium bromide (CsBr), magnesium oxide (MgO), lead fluoride ($PbF_2$) can be used. The lamination of these compounds can be performed by the sputtering method or the vacuum vapor deposition method.

As the substance for the material of the low refractive index layer 7b, inorganic materials such as lithium fluoride (LiF), magnesium fluoride ($MgF_2$), sodium fluoride (NaF) can be used. The lamination of these compounds can be performed by the sputtering method or the vacuum vapor deposition method.

The high light-transmissive dust-proof body 1 of the present invention is mounted on a mask substrate 5 by a double-sided sticky tape 4, to prevent an attachment of foreign matter such as dust, etc. during the light exposure process. Further, since the inorganic film 6 is not decomposed by short wavelength light, the exposure process can be effected stably and the transmittance is high, whereby the exposure efficiency is enhanced.

According to the first embodiment of the present invention, an inorganic film is used as the light-transmissive film of the dust-proof body for a mask substrate, and therefore, a photolysis thereof will not occur even when a short wavelength light such as an excimer laser is irradiated thereon for a long time, and thus a light-transmissive dust-proof body allowing an excellent transmittance of light is obtained.

Also, according to the method of the present invention, the light-transmissive dust-proof body having the excellent properties such as described above can be simply and quickly prepared.

The second embodiment of the light-transmissive dust-proof body according to the present invention will now be explained in detail with reference to the drawings.

Figures 3A, 3B:
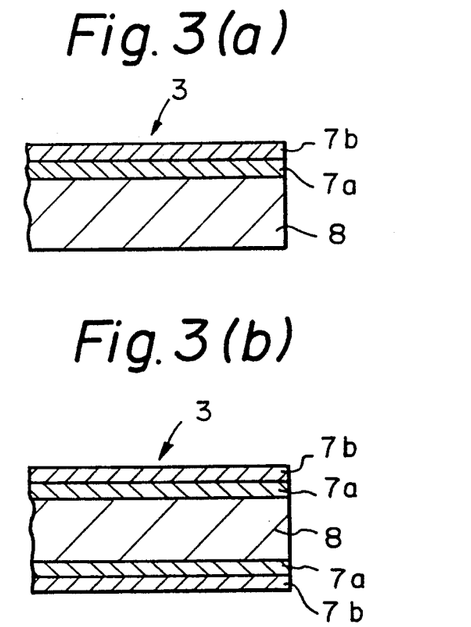

FIGS. 3(a) and (b) are sectional views of a second embodiment of the light-transmissive film according to the present invention. The light-transmissive film 3 has a high refractive index layer 7a laminated on a base layer 8, and a low refractive index layer 7b laminated on the high refractive index layer 7a, thereby providing a three-layer structure of a low refractive index layer 7b/high refractive index layer 7a/base layer 8, as shown in FIG. 3(a), or a five-layer structure of a low refractive index layer 7b/high refractive index layer 7a/base layer 8/high refractive index layer 7a/low refractive index layer 7b as shown in FIG. 3(b).

In the present invention, the base layer 8, which is the main body of the light-transmissive film 3, comprises a transparent thin film and is free from absorption at light wavelengths of 240 to 500 nm employed in the exposure process. Preferably, the base layer 8 is an inorganic film composed mainly of an oxide of silicon, but a cellulose derivative thin film such as nitrocellulose, ethylcellulose, cellulose propionate, and acetylcellulose also can be used depending on the wavelength of the light transmitted.

The thickness of the base layer 8 may be freely determined from the viewpoint of the light transmittance, but the amount of aberration becomes greater if the layer is too thick. Accordingly, preferably a thickness of from 0.2 to 10 $\mu$m, more preferably 0.5 to 5 $\mu$m, is employed.

The refractive indices of the high refractive index layer 7a and the low refractive index layer 7b laminated on one surface or both surfaces of the base layer 8 (if the refractive index of the base layer 8 is defined as n, that of the high refractive index layer 7a as $n_1$, and that of the low refractive index layer 7b as $n_2$) are preferably $n_1$ and $n_2$ as represented by $\sqrt{n} = n_1/n_2$. For example, when the refractive index of the base layer 8 is $n = 1.5$, since the refractive index $n_2$ of the low refractive index layer 7b of the organic polymer generally available is 1.35 to 1.36, the refractive index of the high refractive index layer 7a corresponding thereto becomes 1.65 to 1.67.

In the present invention, the high refractive index layer 7a comprises an inorganic layer, and a layer having the above refractive index can be used.

Also, in the present invention, as the material for the inorganic layer, a layer composed mainly of an inorganic material such as $PbCl_2$, $PbF_2$, MgO, CsBr, $TiO_2$, $Sb_2O_3$, $Al_2O_3$, $In_2O_3$, $La_2O_3$, SiO, $ZrO_2$, $SnO_2$, $CeF_3$, and $LaF_3$ can be used.

The thickness of the high refractive index layer 7a is preferably made $m\lambda/4n_1$ (here m is an integer of 1 or more, $\lambda$ is the wavelength of the light irradiated and $n_1$ is the refractive index of the high refractive index layer 7a).

In the second embodiment of the present invention, the low refractive index layer 7b can be composed of a fluorine type polymer such as tetrafluoroethylene/vinylidene fluoride copolymer, tetrafluoroethylene/vinylidene fluoride/hexafluoropropylene copolymer, or acrylic fluorine polymers such as polyfluoro(meth)acrylate comprising at least one monomer selected from $CH_2CHCOOR^1$ or $CH_2=C(CH_3)COOR^2$ [wherein $R^1$ and $R^2$ are fluoroalkyl groups which may also contain an ethereal oxygen atom at the intermediary position].

The thickness of the low refractive index layer 7b is preferably $m\lambda/4n_2$ (here m is an integer of 1 or more, $\lambda$ is the wavelength of the light irradiated, and $n_2$ is the refractive index of the low refractive index layer 7b).

The high refractive index layer 7a may be formed by a vacuum vapor deposition or sputtering method, but can be also formed by the rotatory film fabrication method by dropwise adding the solutions of the substances for forming the respective layers, dissolved in a solvent, onto the base layer 8.

The high light-transmissive dust-proof body 1 of the present invention is mounted on a mask substrate 5 by a double-sided sticky tape 4, to prevent an attachment of foreign matter such as dust, etc. during the exposure process. When the light-transmissive body 1 consists only of a base layer 8, it is influenced by the film thickness or the wavelength of the light, and thus cannot maintain an excellent light transmittance within a predetermined wavelength range. Also, when a reflection preventive layer composed of a single layer is provided, reflection cannot be completely prevented over the entire predetermined wavelength range, although the tendency thereto may be reduced. The lamination of the high refractive index layer 7a and the low refractive index layer 7b as the reflection preventive layer provides a substantially complete reflection prevention to thereby enhance the light transmittance regardless of the thickness of the base layer 8 or the wavelength of the light, whereby the exposure efficiency is raised. Further, by using the inorganic layer as the high refractive index layer 7a, neither decomposition nor denaturation occurs due to light having a short wavelength, and thus the exposure process can be stably effected.

As described above, according to the second embodiment of the present invention, since the high refractive index layer is an inorganic layer, no decomposition or denaturation will occur due to a light having a short wavelength, such as an i-beam, and therefore, the exposure process can be effected stably at a high transmittance. Also, since the low refractive index layer of the uppermost layer is an organic polymer, peeling of the inorganic layer of the lower layer is prevented.

EXAMPLES

The present invention will now be further illustrated in detail by, but is by no means limited to, the following Examples.

EXAMPLE 1

A mixture of 0.86 mole of tetraethoxysilane (Si-$(OC_2H_5)_4$), 1.7 moles of water, 0.26 g of conc. hydrochloric acid, and 280 ml of isopropanol was heated under reflux for 5 hours, left to stand overnight, and then concentrated to a viscosity of 15 cPs.

About 30 ml of the above-mentioned concentrate was deposited on a nitrocellulose film having a thickness of 0.8 $\mu$m and fixed on a metal frame 150 mm in diameter and 5 mm in height, and rotated at 800 rpm by a spin coater for 60 seconds, to form a silica sol film over the nitrocellulose film.

The combined film, fixed on the metal frame as such, was then placed in a hot circulation system dryer, dried at 90° C. for 10 minutes, left to cool, and then about 30 ml of the above concentrate was again deposited thereon, followed by a repeat of the above rotatory film fabrication and drying process.

Thereafter, the above concentrate was coated on the upper end surface of a frame made of quartz glass 90 mm in diameter, and the quartz glass frame was plastered on the surface at which the thin film silica sol subjected to the above-described film fabrication was coated, and dried in a dryer of 90° C. for 30 minutes to solidify the adhered surface, thus framing the thin film.

The quartz glass having the thin film fixed thereon was placed in an electric furnace, and the temperature was elevated to 200° C. over one hour and maintained thereat for 3 hours. Then the temperature was raised to 600° C. over 2 hours, maintained thereat for 2 hours, and then allowed to cool to room temperature.

The inorganic film 6 thus obtained was found to have a refractive index of 1.53, a film thickness of 2.17 $\mu$m, a light transmittance at a wavelength of 248 nm of 98.8%, and an average light transmittance at wavelengths of 240 to 500 nm of 92.0%.

EXAMPLE 2

$CaF_2$ was coated on both surfaces of the inorganic film obtained in Example 1, as the reflection preventive layer 7, to a thickness of 50 nm, by the vacuum vapor deposition method.

The thus obtained inorganic film 6 applied with a reflection preventive coating exhibited an excellent light transmittance of more than 99.8% over wavelengths of 230 to 260 nm.

COMPARATIVE EXAMPLE 1

Figure 4:
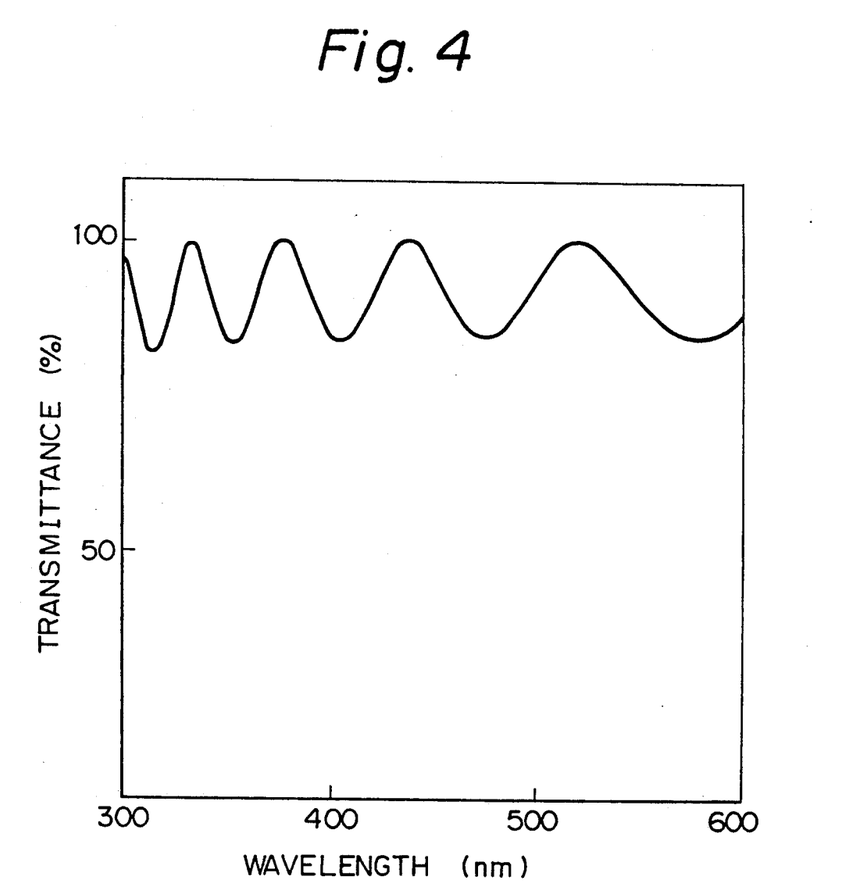

A methylisobutylketone solution of nitrocellulose was added dropwise onto a quartz substrate, and a dust-proof film comprising a nitrocellulose single layer film having a thickness of 0.86 $\mu$m was obtained by the spin coating method, in which the quartz substrate was rotated. FIG. 4 shows the spectral characteristics of the dust-proof film.

COMPARATIVE EXAMPLE 2

Figure 5:
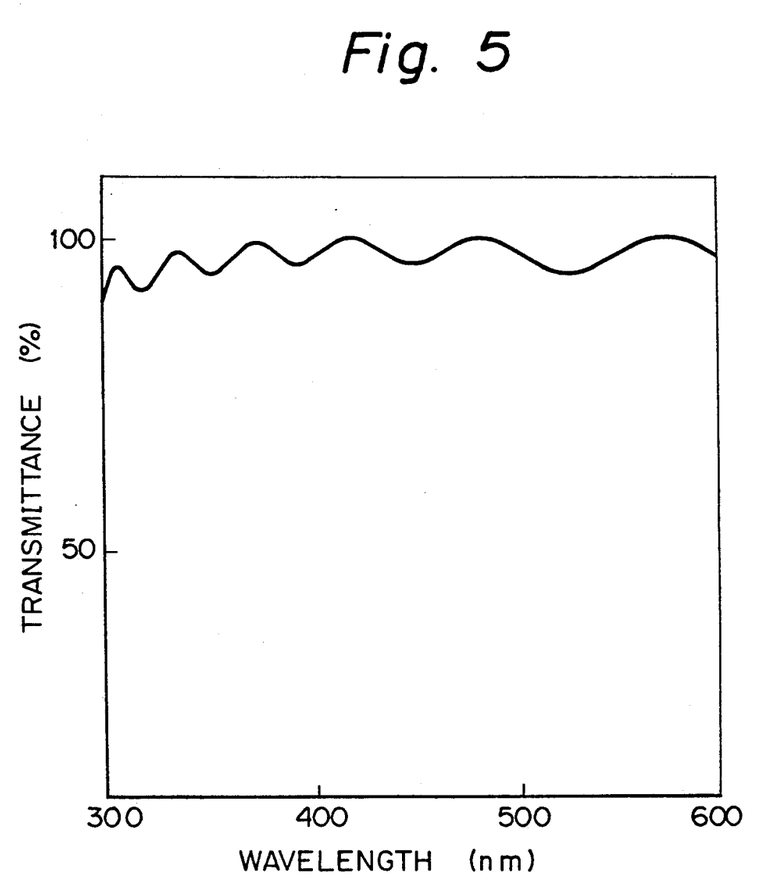

Using nitrocellulose as the base layer (film thickness 0.86 $\mu$m), a polymer of perfluoropentyl acrylate ($CH_2=CHCOOCH_2C_4F_9$) (refractive index = 1.36) was coated to a thickness of 80 nm as the low refractive index substance on both surfaces thereof. FIG. 5 shows the spectral characteristics of the dust-proof film.

EXAMPLE 3

Using nitrocellulose (refractive index=1.51) as the base layer (film thickness 2.8 μm), cerium fluoride ($CeF_3$, refractive index=1.67) was vapor deposited under vacuum to a thickness of 65 nm, as the high refractive index layers, on both surfaces thereof. Next, on both surfaces of the film having the $CeF_3$ vapor deposited thereon, a perfluoropentyl acrylate polymer was spun-coated to a thickness of 80 nm, as the low refractive index layers.

Figure 6:
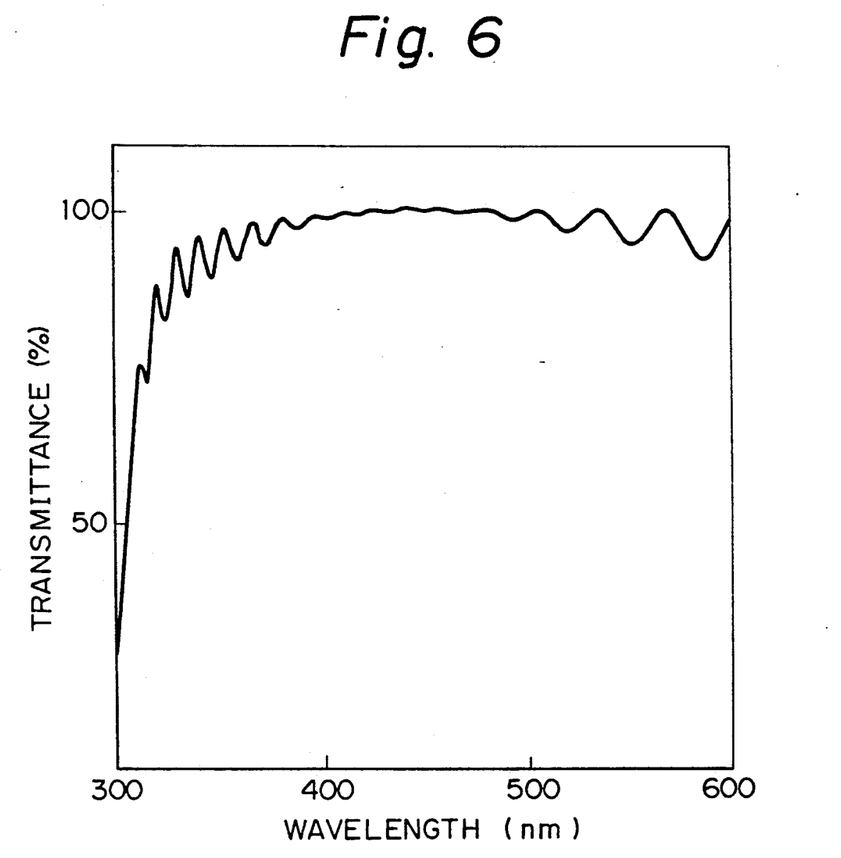

The dust-proof film obtained exhibited an excellent light transmittance over a broad wavelength range, as shown in FIG. 6.

EXAMPLE 4

Figure 7:
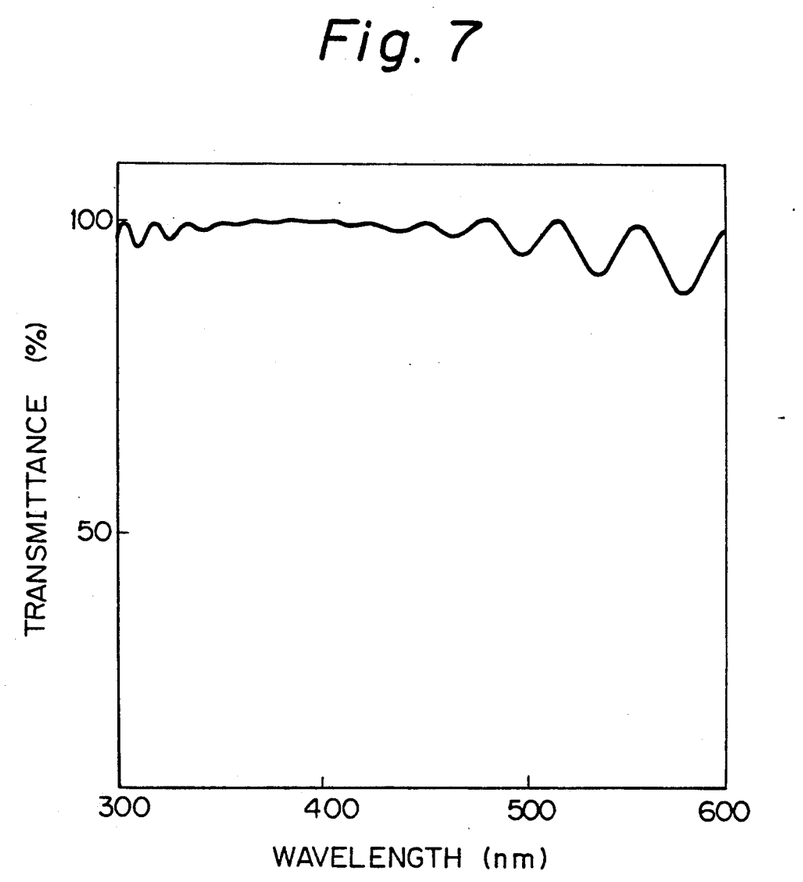

Using cellulose propionate (refractive index=1.49, film thickness 2.8 μm) for the base layer, lanthanum fluoride ($LaF_3$, refractive index=1.64) was vapor deposited to a thickness of 56 nm as the high refractive index layer, and then a perfluoropentylacrylate polymer was spun-coated to a thickness of 67 nm, as the low refractive index layer. The dust-proof film exhibited an excellent light transmittance as shown in FIG. 7.

EXAMPLE 5

Figure 8:
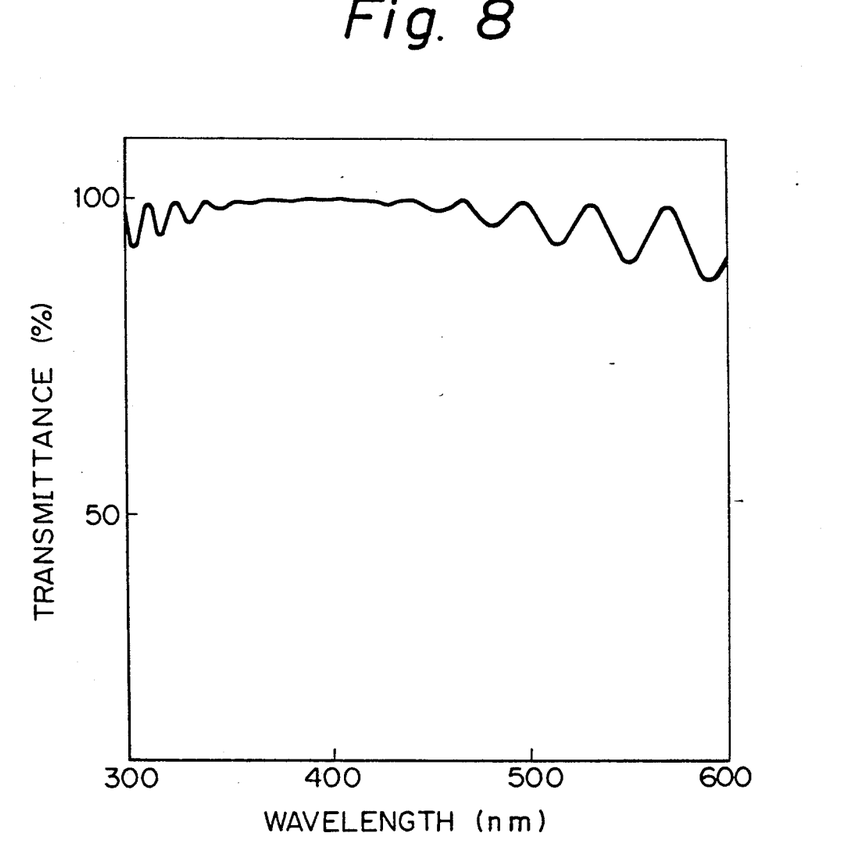

The film fabrication was carried out in the same manner as in Example 4, except that cerium bromide (CsBr, refractive index=1.8) was spun-coated to a thickness of 51 nm as the high refractive index layer, as an aqueous solution, and that a polymer of perfluoroethyl acrylate ($CH_2=CHCOOCH_2CF_3$) (refractive index=1.41) was used as the low refractive index layer and coated to a thickness of 65 nm. The obtained dust-proof film also exhibited an excellent ray transmittance as shown in FIG. 8.

COMPARATIVE EXAMPLE 3

The film fabrication was carried out in the same manner as in Example 3, except that a vinylnaphthalene copolymer was used as the high refractive index layer. The obtained dust-proof film was irradiated with an i-beam (365 nm) having an illuminance of 150 mW/cm$^2$, and the change in the film surface state and the change in light transmittance were examined. As a result, color irregularities were observed on the film surface, and the light transmittance was lowered to 98% at a dose of $2 \times 10^4$ J/cm$^2$.

EXAMPLE 6

The i-beam irradiation of the dust-proof films obtained in Examples 4 and 5 was effected by the same method as in Comparative Example 3.

Both dust-proof films exhibited a very high stability to the i-beam, and no change was observed in the film surface state and light transmittance after an irradiation of $5 \times 10^5$ J/cm$^2$.

We claim:

1. A light transmissive dust-proof body comprising (i) a holding frame and (ii) a transparent light transmissive film; said holding frame (i) being formed so as to be mountable on a mask substrate and to hold said transparent light transmissive film; said light transmissive film (ii) being mounted on the holding frame and having an average transmission of light at a wavelength (λ) in the range of from about 240 to about 500 nm of at least 85% and being (a) a three-layer structure which has, in order, a layer having an index of refraction $n_2$, n layer having an index of refraction n and a base layer, or (b) a five-layer structure which has, in order, a layer having an index of refraction $n_2$, a layer having an index of refraction $n_1$, a base layer, a layer having an index of refraction $n_1$ and a layer having an index of refraction $n_2$; wherein $n_1 > n_2$ said layer having an refractive index $n_1$ being an inorganic layer comprising at least one material selected from the group consisting of CsBr, $CeF_3$ and $LaF_3$; said layer having a refractive index $n_2$ and being an organic layer comprising a polyfluoroalkyl(-meth)acrylate which comprises at least one monomer selected from the group consisting of $CH_2CHCOOR^1$ and $CH_2=C(CH_3)COOR^2$, wherein $R^1$ and $R^2$ are fluoroalkyl groups which may also contain an ethereal oxygen atom at the intermediary position said base layer comprising a transparent thin film of a cellulose derivative, and having a thickness of from 0.5 μm to less than 10 μm and a refractive index n.

2. The light-transmissive dust-proof body according to claim 1, wherein said base layer comprises nitrocellulose or cellulose propionate.

3. The light-transmissive dust-proof body according to claim 1, wherein said refractive indices satisfy the formula (III):

$$\sqrt{n} = n_1/n_2.$$

4. The light-transmissive dust-proof body according to claim 1, wherein said light transmissive film (II) is said three-layer structure.

5. The light-transmissive dust-proof body according to claim 1, wherein said light transmissive film (ii) is said five-layer structure.

6. A method of preparing a metal oxide inorganic film suitable for use as a layer of transparent light transmissive film characterized by an average transmission of light at a wavelength (λ) in the range of from about 240 to about 500 nm of at least 85%, said method comprising:
  (a) preparing a sol from a metal alkoxide;
  (b) fabricating the sol into a film on an organic support material;
  (c) heating and calcining the film to a thickness of from 0.2 to less than 10 μm, whereby the organic support material is decomposed during said heating and calcining step.

7. The method for preparing a metal oxide inorganic film according to claim 6 wherein the metal oxide inorganic film is composed mainly of an oxide of silicon.

8. The method of preparing a metal oxide inorganic film according to claim 6 which further comprises laminating a reflection preventive layer with a thickness $d_2$ on at least one surface of the metal oxide inorganic film, wherein said metal oxide inorganic film has a refractive index ($n_1$) and the reflection preventive layer has a refractive index ($n_2$) wherein the thickness $d_2 = m\lambda/4n_2$, wherein m is an integer of 1 or more, and wherein $\sqrt{n_1} = n_2$.

* * * * *